United States Patent [19]

Lewis

[11] Patent Number: 4,759,043
[45] Date of Patent: Jul. 19, 1988

[54] CMOS BINARY COUNTER

[75] Inventor: Edward T. Lewis, Sudbury, Mass.

[73] Assignee: Raytheon Company, Lexington, Mass.

[21] Appl. No.: 33,381

[22] Filed: Apr. 2, 1987

[51] Int. Cl.[4] .................. H03K 23/44; H03K 21/17
[52] U.S. Cl. ................................ 377/116; 377/117; 377/121
[58] Field of Search .............. 377/115, 116, 117, 121

[56] References Cited

U.S. PATENT DOCUMENTS

| | | | |
|---|---|---|---|
| 3,422,254 | 1/1969 | Lundin | 377/116 |
| 3,798,554 | 3/1974 | Sadlak | 377/116 |
| 3,870,962 | 3/1975 | D'Errico | 328/58 |
| 3,943,378 | 3/1976 | Beutler | 377/117 |
| 4,037,085 | 7/1977 | Minorikawa | 377/116 |
| 4,214,173 | 7/1980 | Popper | 377/117 |
| 4,297,591 | 10/1981 | Roesler et al. | 377/117 |
| 4,611,337 | 9/1986 | Evans | 377/123 |

*Primary Examiner*—John S. Heyman
*Attorney, Agent, or Firm*—Walter F. Dawson; Richard M. Sharkansky

[57] ABSTRACT

A 1.2 μm CMOS binary counter having a 200 MHz clock rate comprises a 4-bit counting section that may be concatenated in multiple 4-bit sections. Each bit stage within a 4-bit counter section uses the current state of such stage to determine what happens in the next stage. Each 4-bit section performs the counting function through a successive process of additions of a lowest order carry-bit input. A count enable signal serves to enable the count process as well as serving as a carry-bit input to a first stage. Count enable effects a counter reset when in a logic "zero" state. Once the count enable is raised to the logic "one" state, the process of counting begins with the rising edge of the first clock pulse. As long as the count enable is maintained, counting continues. When the count enable is reduced to a "zero" state, counting is terminated, with a counter reset occurring on the next sequential rising edge of the clock.

14 Claims, 4 Drawing Sheets

CMOS BINARY COUNTER

BACKGROUND OF THE INVENTION

This invention relates to binary counters and more particularly to a high speed binary counter having a plurality of multi-bit stages which may be concatenated in multiple sections and implemented with CMOS technology.

Binary ripple time counters are well known in the prior art. They have been implemented utilizing CMOS technologies but have the disadvantage of the carry rippling through each stage of the binary counter which takes a considerable amount of time. In order to decrease this carry ripple time, look-ahead circuits comprising AND or NAND gates have been used; however, such gates have required a significant amount of die area as the number of counter stages increases thereby increasing the number of inputs to look-ahead gates. In addition, the time delays associated with the increased gating reduces the counting rate of such a binary counter.

A CMOS transmission gate look-ahead carry circuit has been utilized in a CMOS synchronous binary counter as described in U.S. Pat. No. 3,943,378, inventor R. R. Beutler, which requires only a small amount of die area. However, this is a counter with ripple carry employing a carry pass structure which looks at the previous stage employing toggle flip-flops to effect a count; a compromise is made between obtaining a higher speed binary counter and minimizing usage of the die area.

In U.S. Pat. No. 4,037,085 to inventor Kazuo Minorikawa a binary counter is shown which may have its count advanced at a high speed in accordance with a control signal. Each stage senses its own current state in determining what happens in the next stage; however, in a continuous counting operation considerable time is required in this invention for the carry signal to ripple from one stage to the next stage.

SUMMARY OF THE INVENTION

In accordance with the present invention a high speed, CMOS binary counter integrated circuit is provided comprising a 4-bit counting section that may be concatenated in multiple 4-bit sections. Each 4-bit section performs a counting function through a successive process of additions of a lowest order stage carry input, and each bit stage within a 4-bit section uses the current state of such stage to determine what happens in the next stage. A carry-forward generator instead of a carry look-ahead network provides a carry-forward signal to the next 4-bit counter section with a worse case of only a 2-input gate propagation delay.

In accordance with the present invention a binary counter having a plurality of sequentially coupled stages is provided, each one of the stages comprising a D-type flip-flop having a data input and an output for providing a counter stage output in response to a clock signal, the flip-flop being enabled by a count enable signal, a modulo-two summer having a first input coupled to the counter stage output of the flip-flop and a second input coupled except in a first stage to a carry signal from a previous stage for performing an exclusive-or function on the first input and the second input, the second input in the first stage of the counter being coupled to the count enable signal, and a propagate/kill gate except in a last one of the stages having a first input coupled except in the first stage to the carry signal and a second input coupled to said counter stage output of said flip-flop means for passing said first input when said second input is asserted, the first input in the first stage being coupled to the count enable signal. Each counter stage output is coupled to a carry-forward generator for generating a carry-forward signal to be coupled to a next 4-bit section.

In accordance with a further feature of the invention a binary counter having a plurality of concatenated sections is provided comprising sections for performing a counting function by successive additions of a lowest order carry signal input provided by a count enable signal to a first stage of a first section of said binary counter, and means coupled between each pair of the counter sections for generating a carry-forward signal to the succeeding one of the sections; each of the binary counter stages comprises a D-type flip-flop having a data input and an output for providing a counter stage output in response to a clock signal, the flip-flop being enabled by a count enable signal, a modulo-two summer having a first input coupled to the counter stage output of the flip-flop and a second input coupled except in the first stage of each of the sections to a carry signal from a previous stage for performing an exclusive-or function on the first input and the second input, the second input in the first stage of the first section being coupled to the count enable signal and the second input in a first stage of a second section and successive sections being coupled to the carry-forward signal from an immediately preceding section, and a propagate/kill gate except in a last stage of each one of the sections having a first input coupled except in the first stage to the carry signal and a second input coupled to the counter stage output of the flip-flop for passing the first input when said second input is asserted, the first input in the first stage of the counter being coupled to the count enable signal. Each carry-forward signal generating means in each one of the sections comprises an input signal coupled to the first counter stage output of the first section of the binary counter in addition to an input signal from each counter stage output within such one of the sections.

BRIEF DESCRIPTION OF THE DRAWINGS

Other and further features of the invention will become apparent in connection with the accompanying drawings wherein.

DESCRIPTION OF THE PREFERRED EMBODIMENT

Figure 1:
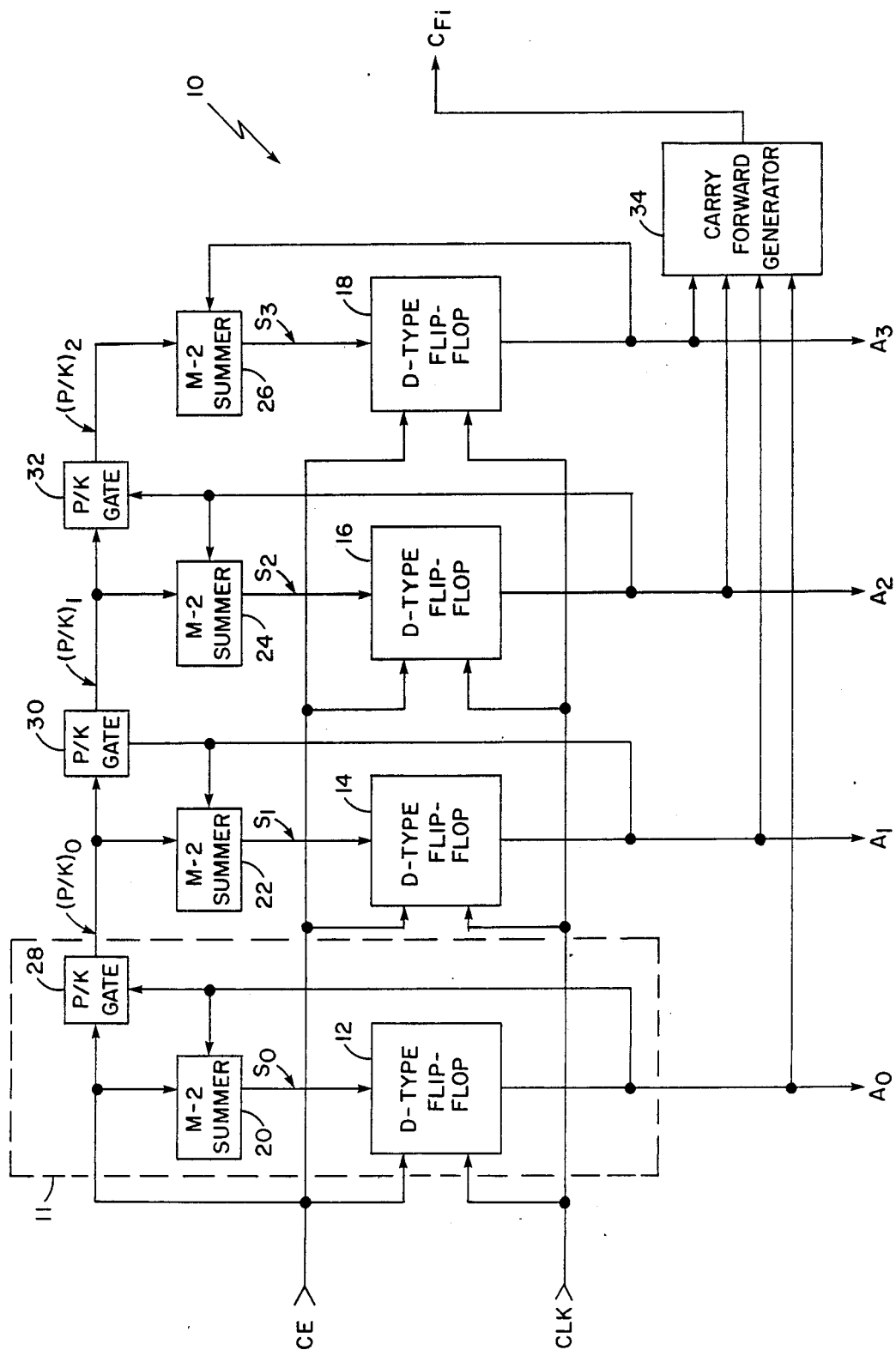
FIG. 1 is a functional block diagram of the invention showing a high speed 4-bit binary counter.
Figure 4:
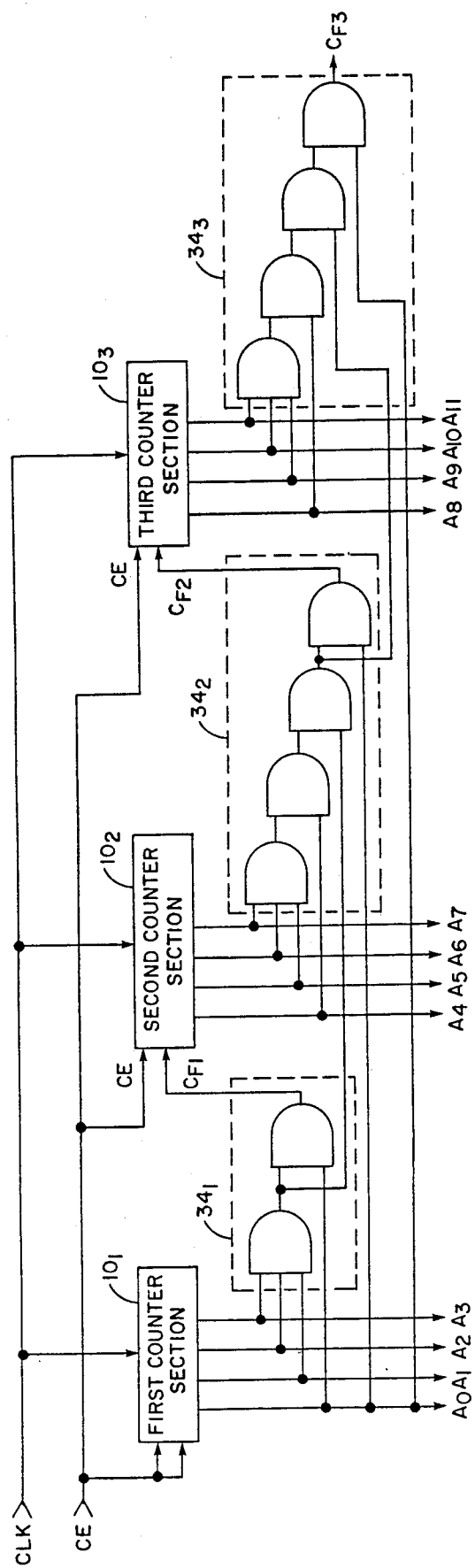
FIG. 4 is a functional block diagram of three concatenated 4-bit binary counter sections showing the carry forward logic networks between the first and second section and the second and third sections.

Referring now to FIG. 1, there is shown a functional block diagram of a 4-bit section 10 of a 1.2 um complementary metal oxide semiconductor (CMOS) high speed binary counter having four sequentially coupled stages capable of operating at greater than a 200 MHz clock rate. Each stage of the four stages within section 10 comprises a D-type flip-flop 12, 14, 16, 18 and a modulo-2 summer 20, 22, 24, 26 coupled to each D-type flip-flop. In addition, there is a propagate/kill (P/K) gate 28, 30, 32 in the first three stages of the 4-bit section 10 but not in the fourth stage because of the presence of a carry-forward generator 34 logic network in counter section 10. The carry-forward generator 34 provides a carry-forward signal ($C_{Fi}$) to another 4-bit counter section when sections are concatenated. Each P/K gate 28-32 is coupled to the output of the D-type flip-flop 12-18 and an output from a P/K gate in a previous stage except of course the first stage of the counter section 10 which receives a count enable (CE) signal instead of a $C_{Fi}$. The outputs $A_0$, $A_1$, $A_2$ and $A_3$ of each counter stage represent the count of the binary counter section 10. There are two input signals to a first counter section 10 which include a counter enable (CE), and a clock (CLK); in subsequent concatenated sections a carry-forward ($C_{Fi}$) signal is provided as an input signal. The counter enable (CE) signal when in the "zero" state resets counter section 10 and when in the "one" state allows the process of counting to occur on the rising edge of the first clock (CLK) signal. As long as CE is maintained at a logic "one", counting continues. In a binary counter comprising one or more concatenated sections (as shown in FIG. 4), the lowest order stage has a CE signal fed to both the CE and $C_{Fi}$ input lines. In all succeeding binary counter sections CE and $C_{Fi}$ signals are applied to separate input lines.

Referring now to FIG. 1 and Table I, the 4-bit binary counter section 10 performs the counting function through successive addition operations of a lowest order carry bit input. The current state of each stage of section 10 is used to determine what happens in the next stage in order to save carry propagation time instead of looking at the state of a previous stage to determine the action of a next stage. Initially, the CE, CLK and each counter stage output $A_0$-$A_3$ signal levels are low or at logic 0. With CLK low, CE is raised to a high or logic 1 resulting in an $S_0$ output from the modulo-2 summer 20 which provides a logic 1 to the input of D-type flip-flop 12. At this time all the P/K gates 28, 30, 32 are in a "k" state (defined as an output being at a logic 0). When the CLK goes to the logic 1 state, the output $S_0$ (logic 1) is transferred to the $A_0$ output of D-type flip flop 12. All other counter stage outputs $A_1$, $A_2$, $A_3$ are at logic 0, since their respective modulo-2 summer outputs $S_1$, $S_2$, $S_3$ were at logic 0. Thus, the first count has occurred ($A_0=1$, $A_1=0$, $A_2=0$, $A_3=0$). With $A_0=1$, and CE=1, the $S_0$ output of modulo-2 summer 20 is at logic 0. Also, with $A_0=1$, the P/K gate 28 is switched to a propagate or "pass" state, which allows CE=1 to pass to the input of modulo-2 summer 22. When a second clock pulse occurs (goes to a logic 1), the counter stage outputs $A_0$ and $A_1$ switch to $A_0=0$ and $A_1=1$ and the second binary count has occurred ($A_0=0$, $A_1=1$, $A_2=0$, $A_3=0$). This counting sequence continues as shown in Table I until all the counter stage outputs $A_0$-$A_3$ reach the logic 1 state, and then the carry forward generator 34 provides a $C_{Fi}$ signal which is coupled to an input of a next 4-bit counter section (as shown in FIG. 4) whereby on the next clock pulse the counter outputs $A_0$, $A_1$, $A_2$ and $A_3$ are switched to the logic 0 state and a lowest order bit in the following 4-bit counter section is set to a logic 1. The current state equation for the $S_0$-$S_3$ signal outputs are shown at the bottom of Table I.

TABLE I

| CE | CLK COUNT | $A_0$ | $A_1$ | $A_2$ | $A_3$ | $S_0$ | $S_1$ | $S_2$ | $S_3$ | $(P/K)_0$ | $(P/K)_1$ | $(P/K)_2$ | $C_{Fi}$ |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 1 | 0 | 0 | 0 | 0 | 0 | 1 | 0 | 0 | 0 | 0 | 0 | 0 | 0 |
| 1 | 1 | 1 | 0 | 0 | 0 | 0 | 1 | 0 | 0 | 1 | 0 | 0 | 0 |
| 1 | 2 | 0 | 1 | 0 | 0 | 1 | 1 | 0 | 0 | 0 | 0 | 0 | 0 |
| 1 | 3 | 1 | 1 | 0 | 0 | 0 | 0 | 1 | 0 | 1 | 1 | 0 | 0 |
| 1 | 4 | 0 | 0 | 1 | 0 | 1 | 0 | 1 | 0 | 0 | 0 | 0 | 0 |
| 1 | 5 | 1 | 0 | 1 | 0 | 0 | 1 | 1 | 0 | 1 | 0 | 0 | 0 |
| 1 | 6 | 0 | 1 | 1 | 0 | 1 | 1 | 1 | 0 | 0 | 0 | 0 | 0 |
| 1 | 7 | 1 | 1 | 1 | 0 | 0 | 0 | 0 | 1 | 1 | 1 | 1 | 0 |
| 1 | 8 | 0 | 0 | 0 | 1 | 1 | 0 | 0 | 1 | 0 | 0 | 0 | 0 |
| 1 | 9 | 1 | 0 | 0 | 1 | 0 | 1 | 0 | 1 | 1 | 0 | 0 | 0 |
| 1 | 10 | 0 | 1 | 0 | 1 | 1 | 1 | 0 | 1 | 0 | 0 | 0 | 0 |
| 1 | 11 | 1 | 1 | 0 | 1 | 0 | 0 | 1 | 1 | 1 | 1 | 0 | 0 |
| 1 | 12 | 0 | 0 | 1 | 1 | 1 | 0 | 1 | 1 | 0 | 0 | 0 | 0 |
| 1 | 13 | 1 | 0 | 1 | 1 | 0 | 1 | 1 | 1 | 1 | 0 | 0 | 0 |
| 1 | 14 | 0 | 1 | 1 | 1 | 1 | 1 | 1 | 1 | 0 | 0 | 0 | 0 |
| 1 | 15 | 1 | 1 | 1 | 1 | 0 | 0 | 0 | 0 | 1 | 1 | 1 | 1 |

Figure 2:
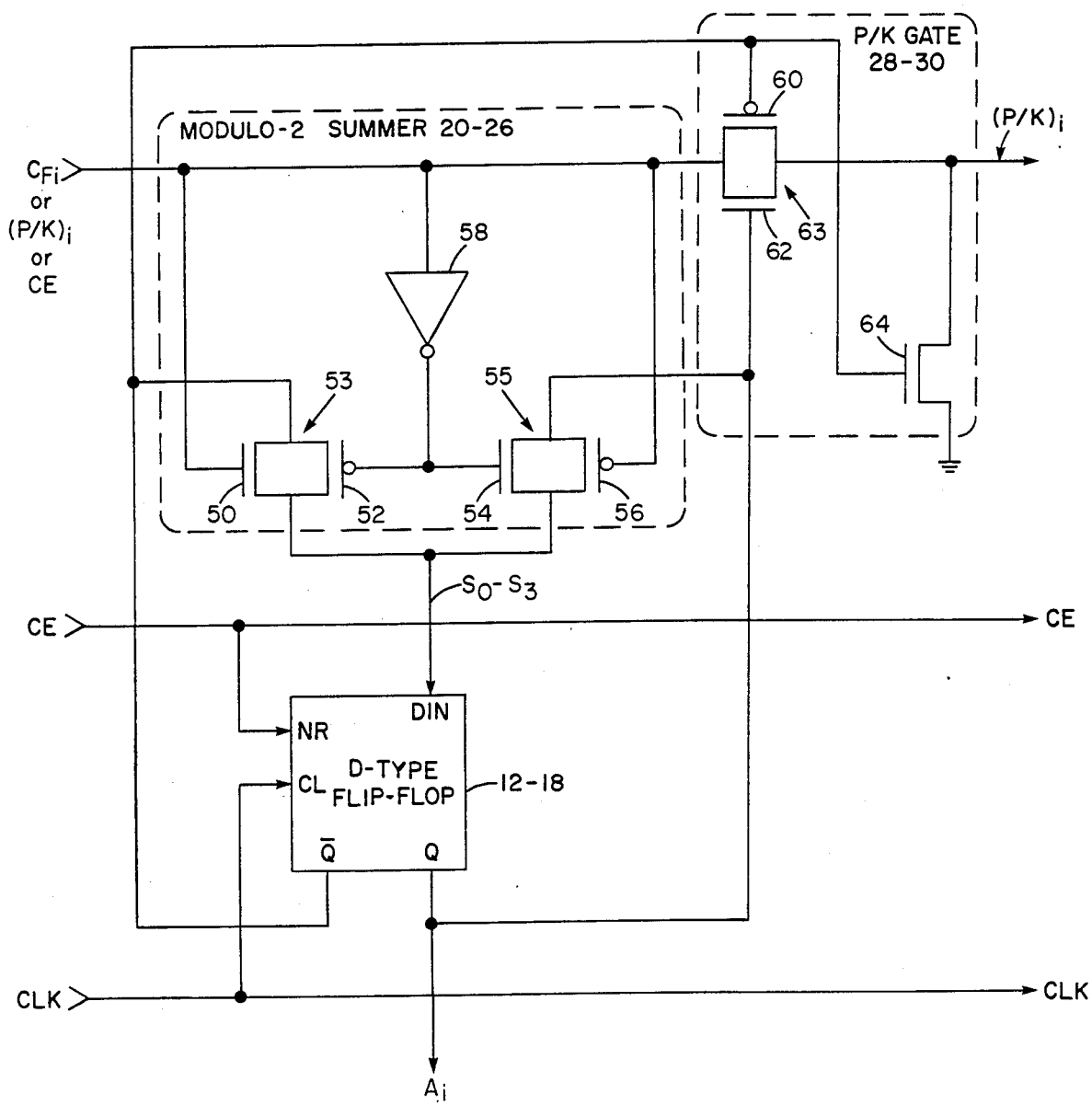
FIG. 2 is a diagram of one stage of the 4-bit binary counter.

Modulo-2 Summer Current State Equations:
$S_0 = CE \oplus A_0$
$S_1 = (P/K)_0 \oplus A_1$
$S_2 = (P/K)_1 \oplus A_2$
$S_3 = (P/K)_2 \oplus A_3$ Referring now to FIG. 2, a more detailed diagram of one stage (e.g. stage 11) of the 4-bit binary counter section 10 is shown. The storage element of each counter stage 11 is implemented with a D-type flip-flop 12-18 with the count enable (CE) signal connected to a NR input and the CLR signal connected to a CL input. The $D_{IN}$ input of each D-type flip-flop 12-18 is connected to an output $S_0$-$S_3$ of the modulo-2 summer (M-2 summer) 20-26. A $\overline{Q}$ output signal of D-type flip-flop 12-18 is connected to a transmission gate 53 in the modulo-2 summer 20-26, and to control gates of P-channel transistor 60 and N-channel transistor 64 in P/K gate 28-30. A "Q" output of D-type flip-flop 12-18, which provides a bit output of the binary counter, is connected to a transmission gate 55 and to a control gate input of N-channel MOS transistor 62. N-channel transistor 62 and P-channel transistor 60 are connected in parallel forming a CMOS transmission gate 63 which is coupled to N-channel transistor 64 forming the P/K gate 28-30 which essentially performs an AND gate logic function. The P/K gate 28-30 either passes or kills (inhibits) a signal at a second input in accordance with the state of a signal at a first input. The modulo-2 summer 20-26 receives a $C_{Fi}$ signal (or a $(P/K)_i$ signal or a CE signal depending on the stage location in a binary counter) and such signal is connected to transmission gates 53 and 55. The $C_{Fi}$ signal is connected to a control gate of N-channel transistor 50 and to a control gate of P-channel transistor 56; it also is connected to inverter 88 which forms the complement of the $C_{Fi}$ input signal and connects such $\overline{C}_{Fi}$ signal to the control gates of P-channel transistor 52 and N-channel transistor 54.

Figure 3:
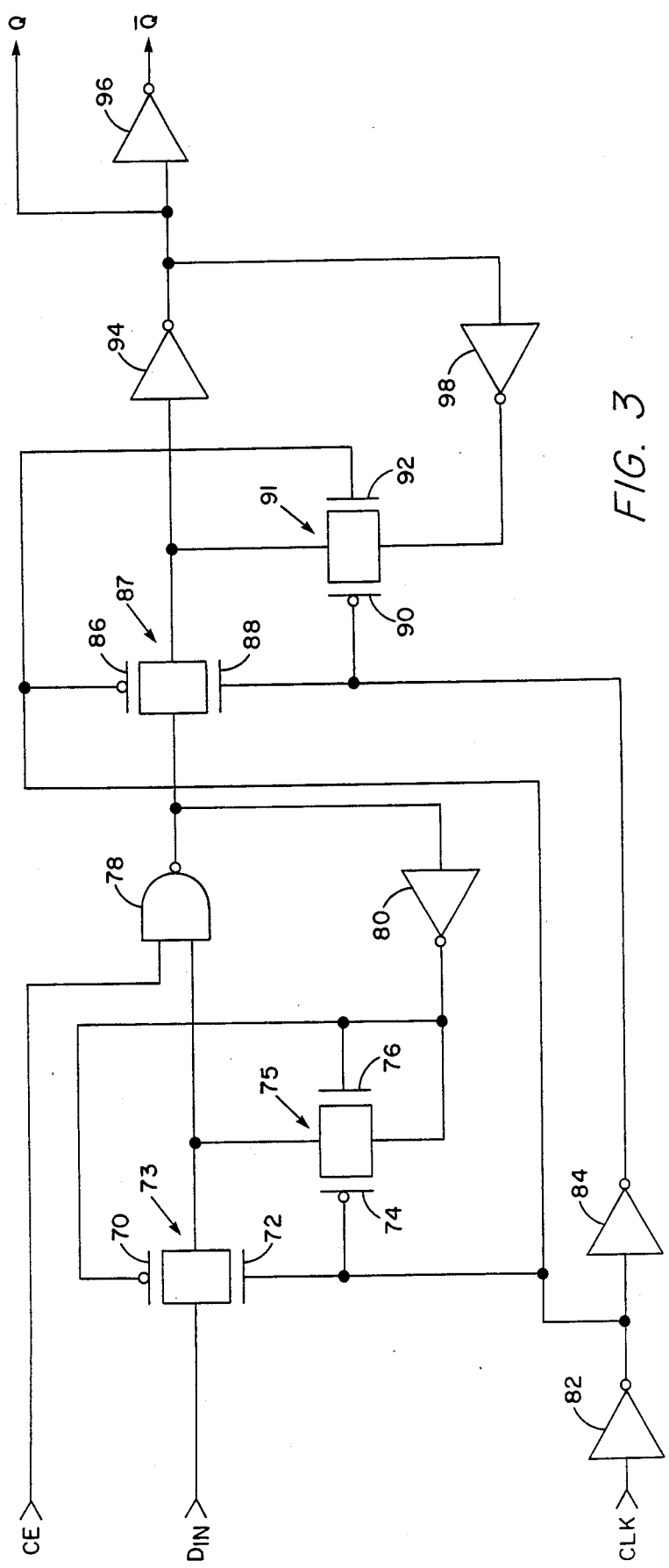
FIG. 3 is a diagram of a delay flip-flop in each stage of the binary counter for storing an accumulated counter output.

Referring now to FIG. 3, a diagram of the CMOS D-type flip-flop 12-18 is shown comprising CMOS transmission gates 73, 75, 87 and 91 for implementation in a binary counter section 10. Such a logic circuit is known to one skilled in the art. AND gate 78 provides for a synchronous reset capability. An inverter 82 functions as a clock buffer/driver for use by the CLK signal within each flip-flop 12-18 of a counter section 10. Inverter 94 and 96 are enhanced to provide an intermediate drive capability for the Q and $\overline{Q}$ output signals of the D-type flip-flop. The use of a D-type flip-flop instead of, for example, a toggle flip-flop, provides for data to already be stored and ready for a clock signal thereby eliminating any delay time consideration of the flip-flop itself from reducing the counter speed.

Referring now to FIG. 4, three binary counter sections are shown in a concatenated embodiment resulting in a 12 stage binary counter with outputs $A_0$-$A_{11}$. The CLK signal is provided to each counter section $10_1$, $10_2$, $10_3$ along with the CE signal to each counter section. As previously noted the lowest order section $10_1$ has the CE signal fed to both the CE input line and a $C_{Fi}$ input line whereas in the succeeding counter sections, the appropriate $C_{Fi}$ signal from a previous counter section is fed to a $C_{Fi}$ input line. Between each counter section is a carry forward generator $34_1$, $34_2$, $34_3$ network each one of which only produces one gate delay during the counting sequence because of the inherent design of this high speed binary counter.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A binary counter having a plurality of sequentially coupled stages, each one of said stages comprising:
    a flip-flop means having a data input and an output for providing a counter stage output in response to a clock signal, said flip-flop means being enabled by a count enable signal;
    a modulo-two summer means having a first input and an output coupled respectively to said flip-flop means output and data input in said stage and a second input coupled except in a first stage to a carry signal from a previous stage for performing an exclusive-or function on said first input and said second input, said second input in a first stage of said counter being coupled to said count enable signal; and
    a gating means except in a last one of said stages having a first input coupled except in said first stage to said carry signal from a previous counter stage gating means output and a second input coupled to said flip-flop means output in said counter stage for passing said first input when said second input is asserted, said first input in said first stage being coupled to said count enable signal, said gating means having an output coupled to said second input of said modulo-two summer means of the next succeeding counter stage.

2. The binary counter as recited in claim 1 wherein: said flip-flop means comprises a D-type flip-flop.

3. The binary counter as recited in claim 1 wherein: said count enable signal performs a clear function for said flip-flop means.

4. A binary counter as recited in claim 1 wherein: said flip-flop means, modulo-two summer means, and gating means are integrated in a CMOS integrated circuit.

5. The binary counter as recited in claim 1 wherein: said binary counter comprises means coupled to said output of each counter stage for generating a carry-forward signal.

6. The binary counter as recited in claim 5 wherein: said carry-forward signal generator means provides no more than a two-input gate propagation delay.

7. The binary counter as recited in claim 5 wherein: said flip-flop means, modulo-two summer means, gating means and carry-forward means are integrated in a CMOS integrated circuit.

8. A binary counter having a plurality of concatenated sections comprising:
    a plurality of binary counter stages in each of said sections for performing a counting function by successive additions of a lowest order carry signal input provided by a count enable signal to a first stage of a first section of said binary counter;
    means coupled between each pair of said counter sections for generating a carry-forward signal to the succeeding one of said sections;
    each of said binary counter stages comprising:
    (a) flip-flop means having a data input and an output for providing a counter stage output in response to a clock signal, said flip-flop means being enabled by a count enable signal;
    (b) modulo-two summer means having a first input and an output coupled respectively to said flip-flop means output and data input in said counter stage and a second input coupled except in said first stage of each of said sections to a carry signal from a previous stage for performing an exclusive-or function on said first input and said second input, said second input in said first stage of said first section being coupled to said count enable signal and said second input in a first stage of a second section and successive sections being coupled to said carry-forward signal from an immediately preceding section; and
    (c) gating means except in a last stage of each one of said sections having a first input coupled except in said first stage to said carry signal from a previous counter stage gating means output and a second input coupled to said flip-flop means output in said counter stage for passing said first input when said second input is asserted, said first input in said first stage of said counter being coupled to said count enable signal, said gating means having an output coupled to said second input of said modulo-two summer means of the next succeeding counter stage.

9. The binary counter as recited in claim 8 wherein: said flip-flop means comprises a D-type flip-flop.

10. The binary counter as recited in claim 8 wherein: said count enable signal performs a clear function for said flip-flop means.

11. The binary counter as recited in claim 8 wherein: each of said carry-forward signal generator means provides no more than a two-input gate propagating delay.

12. The binary counter as recited in claim 8 wherein: each carry-forward signal generating means in each one of said sections comprises an input signal coupled to said first counter stage output of said first section of said binary counter.

13. The binary counter as recited in claim 12 wherein: said carry-forward signal generating means in each one of said sections further comprises an input signal from each counter stage output within said one of said sections.

14. A binary counter as recited in claim 8 wherein: said concatenated sections including said carry-forward generator means are integrated in a CMOS integrated circuit.

* * * * *